(12) United States Patent
Kim et al.

(10) Patent No.: US 8,422,291 B2
(45) Date of Patent: Apr. 16, 2013

(54) STORAGE DEVICE AND METHOD FOR READING THE SAME

(75) Inventors: Yong June Kim, Seoul (KR); Heeseok Eun, Hwaseong-si (KR); Han Woong Yoo, Seoul (KR); Jaehong Kim, Seoul (KR); Hong Rak Son, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 369 days.

(21) Appl. No.: 12/662,329

(22) Filed: Apr. 12, 2010

(65) Prior Publication Data

US 2010/0302850 A1 Dec. 2, 2010

(30) Foreign Application Priority Data

May 26, 2009 (KR) .................. 10-2009-0045838

(51) Int. Cl.
*G11C 16/04* (2006.01)

(52) U.S. Cl.
USPC .............................. 365/185.03; 365/185.09

(58) Field of Classification Search ............ 365/185.09, 365/185.17, 185.21, 189.09, 201, 185.03; 714/722, 718

See application file for complete search history.

(56) References Cited

U.S. PATENT DOCUMENTS

| 6,850,441 | B2 | 2/2005 | Mokhlesi | |
|---|---|---|---|---|
| 7,092,292 | B2 | 8/2006 | Mokhlesi | |
| 2003/0137877 | A1 | 7/2003 | Mokhlesi | |
| 2003/0151950 | A1* | 8/2003 | Tamada et al. | 365/185.19 |
| 2005/0057979 | A1 | 3/2005 | Mokhlesi | |
| 2007/0279982 | A1 | 12/2007 | Shibata | |
| 2008/0094914 | A1* | 4/2008 | Park et al. | 365/185.24 |
| 2008/0201621 | A1* | 8/2008 | Sato | 714/718 |
| 2009/0282186 | A1* | 11/2009 | Mokhlesi et al. | 711/103 |

FOREIGN PATENT DOCUMENTS

| JP | 2005-520270 | 7/2005 |
|---|---|---|
| JP | 2007-323731 | 12/2007 |
| KR | 10-2003-0063130 | 7/2003 |
| KR | 10-2004-0081462 | 9/2004 |
| KR | 10-2007-0115755 | 6/2007 |
| KR | 10-0830580 | 5/2008 |
| WO | WO 03/063171 | 7/2003 |

* cited by examiner

*Primary Examiner* — Douglas King

(74) *Attorney, Agent, or Firm* — Harness, Dickey & Pierce, P.L.C.

(57) ABSTRACT

The storage device includes a storage unit configured to store data, an error controlling unit configured to correct an error of the data read out from the storage unit according to at least one read level, and a read level controlling unit configured to control the at least one read level when the error is uncorrectable. The read level controlling unit is configured to measure a distribution of memory cells of the storage unit, configured to filter the measured distribution, and configured to reset the at least one read level based on the filtered distribution.

15 Claims, 22 Drawing Sheets

STORAGE DEVICE AND METHOD FOR READING THE SAME

CROSS-REFERENCE TO RELATED APPLICATION(S)

This U.S. non-provisional patent application claims priority under 35 U.S.C. §119 of Korean Patent Application No. 10-2009-0045838, filed on May 26, 2009, the entire contents of which are hereby incorporated by reference.

BACKGROUND

1. Field

Example embodiments of inventive concepts relate to a storage device and a method for reading the same.

2. Description of the Related Art

Semiconductor memory devices are generally classified into volatile semiconductor memory devices and non-volatile semiconductor memory devices. Although read and writing speeds of the volatile semiconductor memory devices are relatively fast, data stored in the volatile semiconductor memory devices is erased when an external power supply source is shut off. On the other hand, the nonvolatile semiconductor memory devices retain stored data even when an external power supply source is shut off.

In MROMs, PROMs and EPROMs, generally, users have difficulty in updating stored data because it is inconvenient to autonomously erase and write data in a system. On the other hand, since it is possible to electrically erase and write data from/to EEPROMs, EEPROM are being increasingly applied to system programming or auxiliary memory devices that require constant updates. Particularly, since having a higher degree of integration than typical EEPROMs, flash EEPROMs are very useful for large-capacity auxiliary memory devices. Among the flash EEPROMs, a NAND-type flash EEPROM (hereinafter, referred to as a NAND-type flash memory) tends to have a higher degree of integration than other flash EEPROMs.

Recently, as high-integration requirements for memory devices increase, multi-bit memory devices that store multiple bits in one memory cell are being widely used. In the memory cells of a multi-bit flash memory device, the intervals between threshold voltage distributions must be generally close. Thus, the number of program/delete cycles (or durability) that does not cause reduction of data retention characteristics and quality is an issue in regard to data reliability.

Reduction of the sizes of a semiconductor memory device and operation voltage results in an increase of data reading errors with respect to noises. Noise sources include thermal noises and Random Telegraph Signal (RTS) noises.

SUMMARY

Example embodiments of inventive concepts provide a storage device and a method for reading the same, which can reduce data reading errors.

Example embodiments of inventive concepts also provide a storage device and a method for reading the same, which can filter a measured distribution of memory cells and change a read level based on the filtered distribution.

According to example embodiments of inventive concepts, the storage device includes a storage unit configured to store data, an error controlling unit configured to correct an error of the data read out from the storage unit according to at least one read level, and a read level controlling unit configured to control the at least one read level when the error is uncorrectable. The read level controlling unit is configured to measure a distribution of memory cells of the storage unit, configured to filter the measured distribution, and configured to reset the at least one read level based on the filtered distribution.

In example embodiments of inventive concepts, the storage unit is a NAND flash memory, and the read level controlling unit is configured to filter the measured distribution by units of at least one word line.

In example embodiments of inventive concepts, the storage unit is a NAND flash memory, and the read level controlling unit is configured to filter the measured distribution within a portion of a voltage section of the measured distribution.

In example embodiments of inventive concepts, the read level controlling unit includes a filter configured to filter the measured distribution.

In example embodiments of inventive concepts, the read level controlling unit includes a modifier configured to modify the measured distribution. The filter is configured to filter the modified distribution.

In example embodiments of inventive concepts, the modifier is configured to modify a first region of a plurality regions of the measured distribution in which a plurality of local minima exist where there is difficulty in setting the read level and configured to input values for at least a second region of the plurality regions separate from the first region.

In example embodiments of inventive concepts, the values include at least one of a saturation value, an interpolation value, and a mean value, where the saturation value is a constant, the interpolation value is the number of memory cells measured as a result of a read operation of the threshold voltage distribution, and the mean value is an estimation value.

In example embodiments of inventive concepts, the filter is configured to remove at least one of a plurality of local minima from the distribution of memory cells, and the read level controlling unit is configured to set the read level based on at least one of a remaining local minimum of the plurality of local minima from the filtered distribution.

In example embodiments of inventive concepts, the filter is a Finite Impulse Response (FIR) filter configured to filter according to the equation, $y(n)=h(n)*x(n)$, where $x(n)$ is a number of memory cells according to a threshold voltage (n), $h(n)$ is a transfer function, $y(n)$ is a value filtered by the filter, and * defines a convolution.

In example embodiments of inventive concepts, the storage unit is a NAND flash memory including, a memory cell array including a plurality of memory blocks having a plurality of memory cells, a row decoder configured to select one of the memory blocks according to an input address, an input/output buffer circuit configured to temporarily store data at least one of to be loaded to and read out from the memory cell array, and a control logic configured to store reference voltages of the read level. The read level controlling unit is configured to change the reference voltages of the read level.

In example embodiments of inventive concepts, the storage unit is a memory device, and the error controlling unit and the read level controlling unit are provided in a memory controller configured to control the memory device.

According to example embodiments of inventive concepts, a method for reading a storage device includes determining whether to convert a read level according to an error of data that is read according to at least one first read level, first measuring a distribution of memory cells of the storage device, filtering the measured distribution, setting at least one second read level, second measuring the distribution of the memory cells of the storage device based on the filtered distribution when the read level is converted, and reading the data based on the at least one second read level.

In example embodiments of inventive concepts, the filtering of the measured distribution includes modifying the measured distribution and filtering the modified distribution.

In example embodiments of inventive concepts, the method further includes resetting of the at least one second read level after the reading.

In example embodiments of inventive concepts, the determining, the first measuring, the filtering, the setting, the second measuring, the reading and the resetting are performed repeatedly until the second read level satisfies an error correction threshold.

In example embodiments of inventive concepts, the determining includes converting the read level from the at least one second read level to the at least one first read level based on an error correction threshold.

BRIEF DESCRIPTION OF THE DRAWINGS

The accompanying drawings are included to provide a further understanding of the example embodiments of inventive concepts, and are incorporated in and constitute a part of this specification. The drawings illustrate example embodiments of inventive concepts and, together with the description, serve to explain principles of inventive concepts. In the drawings.

DETAILED DESCRIPTION

Figure 1:
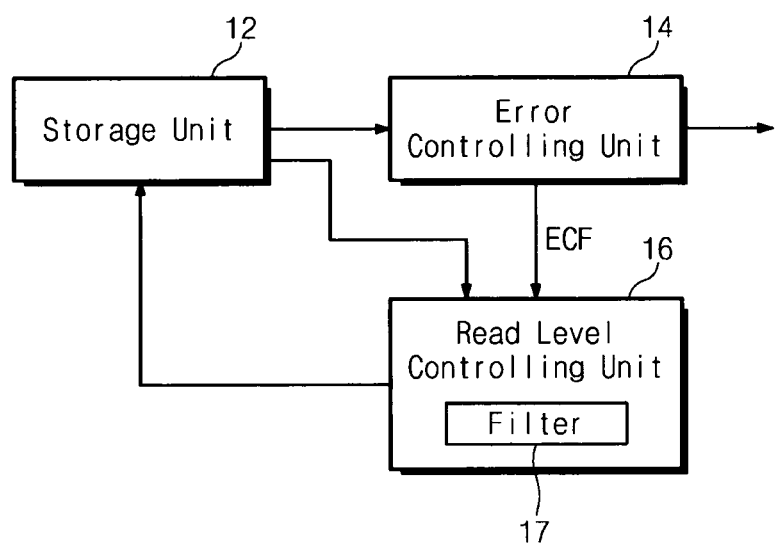
FIG. 1 is a block diagram illustrating a storage device according to example embodiments of inventive concepts.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

Example embodiments of the inventive concept will be described below in more detail with reference to the accompanying drawings. Example embodiments of inventive concept may, however, be embodied in different forms and should not be construed as limited to example embodiments set forth herein. Rather, these example embodiments are provided so that this disclosure will be thorough and complete, and will fully convey the scope of example embodiments of inventive concepts to those skilled in the art.

In a storage device according to example embodiments of inventive concepts, a new read level may be set using a filtered distribution. Thus, the storage device may be set to an optimum read level.

FIG. 1 is a block diagram illustrating a storage device according to example embodiments of inventive concepts. Referring to FIG. 1, the storage device 10 may include a storage unit 12, an error controlling unit 14, and a read level controlling unit 16. The read level controlling unit 16 may allow a filter 17 to filter a measured distribution of memory cells, and may reset a read level (e.g., a read voltage in a flash memory) from the filtered distribution. Here, the memory cells are data storage spaces of the storage unit 12, and the distribution thereof relates to the number of the memory cells according to the read level.

Figure 2:
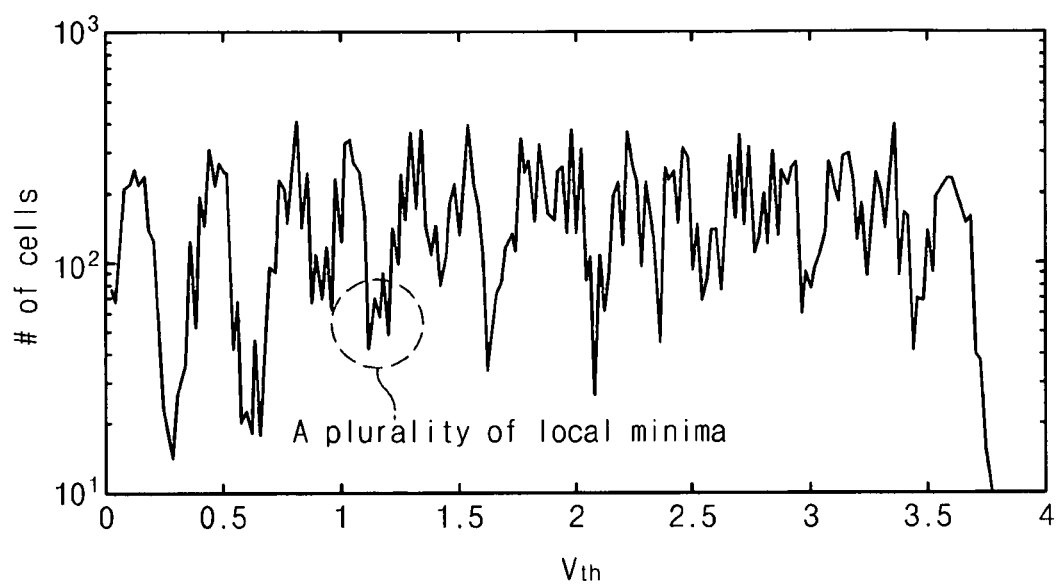
FIG. 2 is a diagram illustrating a measured distribution of memory cells.

For example, when the storage unit 12 is a NAND flash memory, the measured distribution of memory cells with respect to one of word lines may be defined as the number of the memory cells passed while the read voltage is increasing by about 0V to about 20 mV. The measured distribution of the memory cells is shown in FIG. 2.

The storage 12 may store data and output the stored data according to a read operation. The storage unit 12 may store data encoded into error correction codes. Also, data outputted from the storage unit 12 may be determined based on the set read level. Here, the read level, where a default value is stored in the storage unit 12, may be changed by the read level controlling unit 16.

The storage unit 12 may include a memory having a memory cell, a stored data bit value of which is determined according to the read level. For example, the storage unit 12 may include DRAMs, SRAMs, SDRAMs, NAND flash memories, NOR flash memories, Magnetoresistive RAMs (MRAMs), Ferroelectric RAMs (FRAMs), and Phase-change RAMs (PRAMs).

The error controlling unit 14 may detect and correct errors of outputted data. The error controlling unit 140 may decode data into error correction codes. The error controlling unit 14 may be implemented with various code decoders. For example, decoders performing a nonsystematic code decoding or a systematic code decoding may be used. The error controlling unit 14 may output an Error Correction Failure (ECF) signal when an error of outputted data can not be corrected.

The read level controlling unit 16 may set a new read level in response to the ECF signal. The read level controlling unit 16 may include the filter 17 for filtering the measured distribution of memory cells from the storage unit 12. Here, the filter 17 may include various kinds of filters. Examples of the filter 17 may include digital filters, analog filters, adaptive filters, and matched filters. For example, the digital filter may include Finite Impulse Response (FIR) filters and Infinite Impulse Response (IIR) filters.

The read level controlling unit 16 may set a new read level based on the distribution filtered by the filter 17. When the storage unit 12 is a flash memory, the read level controlling unit 16 may set new reference voltages with respect to the read level of the flash memory, based on the filtered distribution. In this case, the reference voltages are read voltages for data reading. A read operation may be again performed on the storage unit 12 based on the newly set read level.

The storage device 10 may set a new read level to perform a read operation again when an error of read data can not be corrected. Thus, data reading errors may be reduced.

In a typical storage device, due to various interferences such as Random Telegraph Signals (RTS), charges loss, coupling, common selection line noise, and back pattern dependency, the distribution of the measured memory cells may not be smooth as shown in FIG. 2. In a typical storage device, for example, it is difficult to find a read level when a plurality of local minima exist in the distribution of the memory cell. For instance, when a read level is set using an algorithm finding the valley, a different nearby local minima may be set to a read level instead of an optimum read level. Thus, the number of data reading errors may be increased.

On the other hand, in the storage device 10 according to example embodiments of inventive concepts, the distribution of the measured memory cells may be filtered, and then a new read level may be set based on the filtered distribution. Thus, in the storage device 10, a plurality of local minima may be removed by filtering the distribution of the memory cells. Accordingly, in the storage device 10, an optimum read level may be set when a new read level is set.

Hereinafter, for convenience of explanation, the storage unit 12 will be assumed to be a NAND flash memory.

Figure 3:
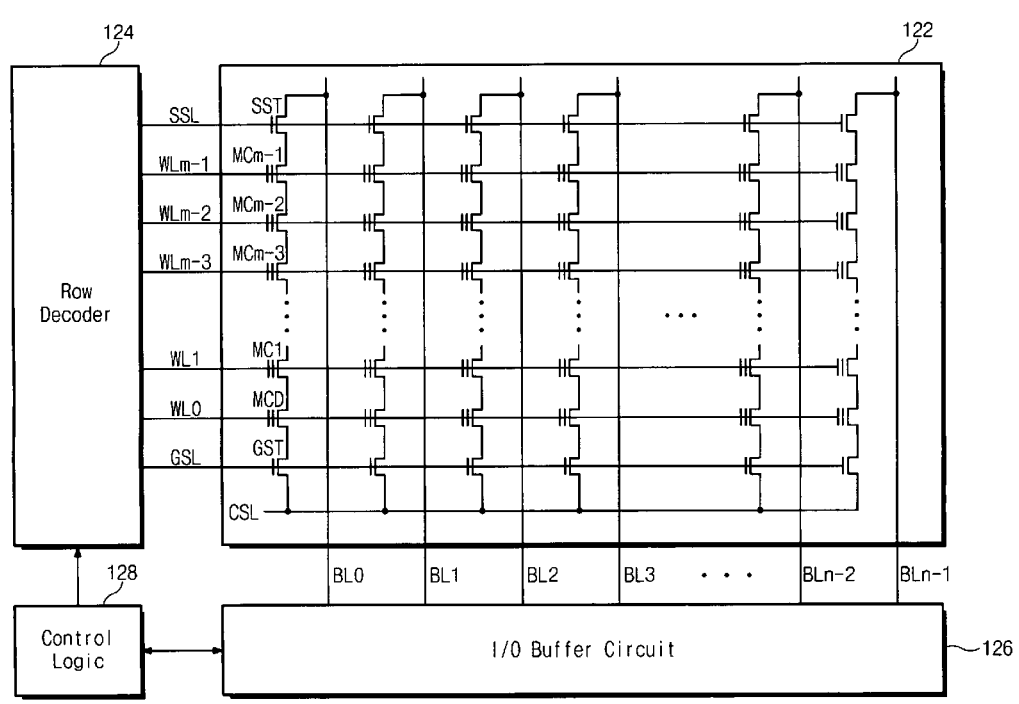
FIG. 3 is a block diagram illustrating a storage unit according to example embodiments of inventive concepts.

FIG. 3 is a block diagram illustrating a storage unit according to example embodiments of inventive concepts. Referring to FIG. 3, the storage unit 12 may be a NAND flash memory including a memory cell array 122, a row decoder 124, an input/output buffer circuit 126, and a control logic 128. The control logic 128 may store reference voltages of a read level. The reference voltages of the read level may be changed by the read level controlling unit 16 shown in FIG. 1.

The memory cell array 122 may include a plurality of bit lines BL0 to BLn−1, a plurality of word lines WL0 to WLm−1, and a plurality of memory cells disposed in the regions where the bit lines and the word lines cross each other. The memory cell array 122 may include a plurality of memory blocks. However, only one memory block is shown in FIG. 3. The respective memory blocks of the memory cell array 122 may include a plurality of cell strings. The respective strings, as shown in FIG. 3, may include a string select transistor SST, a ground select transistor GST, and m memory cells MC0 to MCm−1 serially connected between the string select transistor SST and the ground select transistor GST. Here, the memory cells MC0 to MCm−1 may be a Single Level Cell (SLC) or a Multi Level Cell (MLC).

The drain of the string select transistor SST of each string may be connected to the corresponding bit line, and the source of the ground select transistor GST may be connected to a common source line CSL. The plurality of word lines WL0 to WLm−1 may be arranged to cross the strings. The word lines WL0 to WLm−1 may be connected to the memory cells MC0 to MCm−1 corresponding to the respective strings. A program/readout voltage may be applied to a selected word line to program/read out data to/from selected memory cells. The bit lines BL0 to BLn−1 may be electrically connected to the input/output buffer 126.

The row decoder 124 may select a memory block according to an input address, and may select a word line of the selected memory block to be driven. For example, the row decoder 124 may decode the input address upon a program operation to select a word line to be driven from the selected memory block. Here, a program voltage from a high-voltage generator (not shown) may be applied to the selected word line.

The input/output buffer 126 may temporarily store data loaded to the memory cell array 122 upon the program operation, or may temporarily store data read out from the memory cell array 122 upon a read operation. The input/output buffer 126 may be connected to the memory cell array 122 through the plurality of bit lines BL0 to BLn−1. A plurality of latches (not shown) corresponding to the respective bit lines may be provided in the input/output buffer 126. The respective latches may store data that are to be programmed or read out.

Upon the program operation, the input/output buffer 126 may apply a ground voltage (for example, GND) or power voltage (VDD) to the bit line according to the data values stored in the respective latches. For example, the ground voltage (GND) may be applied to a bit line (e.g., bit line connected to a memory cell to be programmed) connected to a latch in which data '0' is stored. The power voltage (VDD) may be applied to a bit line (i.e., bit line connected to a memory cell not to be programmed) connected to a page buffer in which data '1' is stored.

The control logic 128 may generate high voltages necessary for respective operations in response to inputted control signals (CTRL, for example, /CE, /RE, /WE, CLE, ALE, and /WP) to provide the high voltages to the row decoder 124, and may control all operation of internal blocks of the storage unit 12. For example, the control logic 128 may store the reference voltages of the read level upon the read operation. For instance, the control logic 128 may allow reference voltages of a default read level used in a common read operation (when data reading errors can be corrected) to be stored, and allow reference voltages of a read level used in an uncommon read operation (when data reading errors can not be corrected) to be separately stored. Here, the reference voltages of the read level used in the uncommon read operation may be set by the read level controlling unit 16 shown in FIG. 1.

Figure 4:
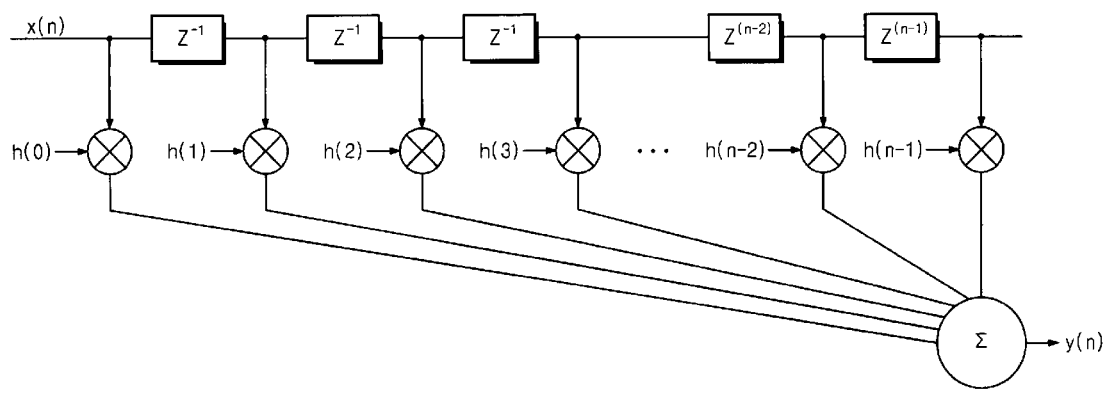
FIG. 4 is a diagram illustrating a filter according to example embodiments of inventive concepts.

FIG. 4 is a diagram illustrating a filter according to example embodiments of inventive concepts. Referring to FIG. 4, the filter 17, which is a Finite Impulse Response Filter (FIR) filter, may satisfy Equation (1).

$$y(n)=h(n)*x(n) \quad (1)$$

where x(n) is the number of memory cells according to a threshold voltage (n), h(n) is a transfer function, y(n) is a value filtered by the filter 17, and '*' defines a convolution.

Figure 5:
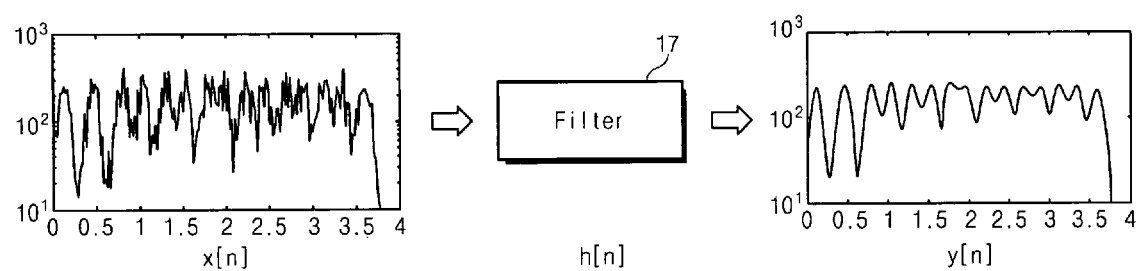
FIG. 5 is a diagram illustrating a filtering result of the distribution of memory cells using the filter of FIG. 4.

FIG. 5 is a diagram illustrating a filtering result of the distribution of memory cells using the filter of FIG. 4. Referring to FIG. 5, y(n) may be outputted after local minima of x(n) are removed by the filter 17. For example, the local minima may be removed from the measured distribution of the threshold voltages through the filtering. A read level may be set from the outputted threshold voltage distribution.

Figure 6:
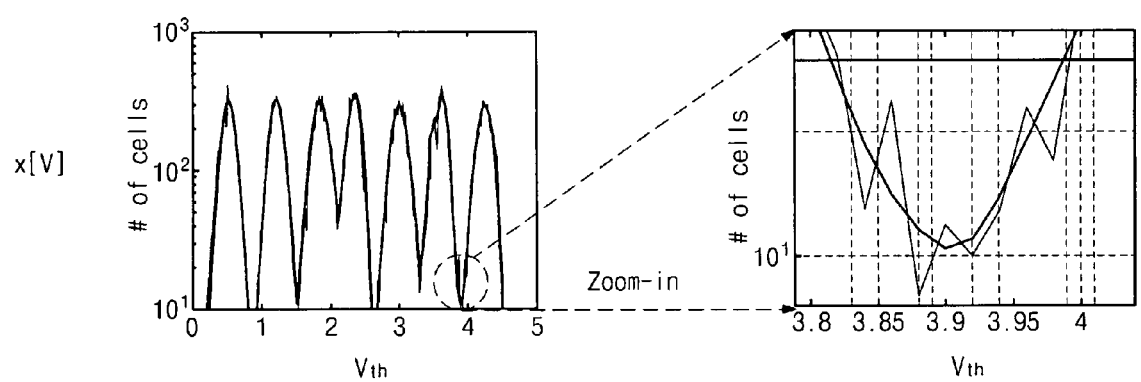
FIG. 6 is a diagram illustrating a measured threshold voltage distribution and a filtered threshold voltage distribution thereof in a NAND flash memory having 3-bit multi level cells.

FIG. 6 is a diagram illustrating a measured threshold voltage distribution and a filtered threshold voltage distribution thereof in a NAND flash memory having 3-bit multi level cells. Referring to FIG. 6, local minima may be removed from a measured threshold voltage distribution, leading to a filtered threshold voltage distribution. Thus, a read level may be accurately set.

In a typical memory system, there is a difficulty in setting an optimum read level when there are many local minima as shown in FIG. 6. On the other hand, since a read level may be set based on a filtered distribution in the storage device 10 according to example embodiments of inventive concepts, an optimum or improved read level may be set.

Figure 7:
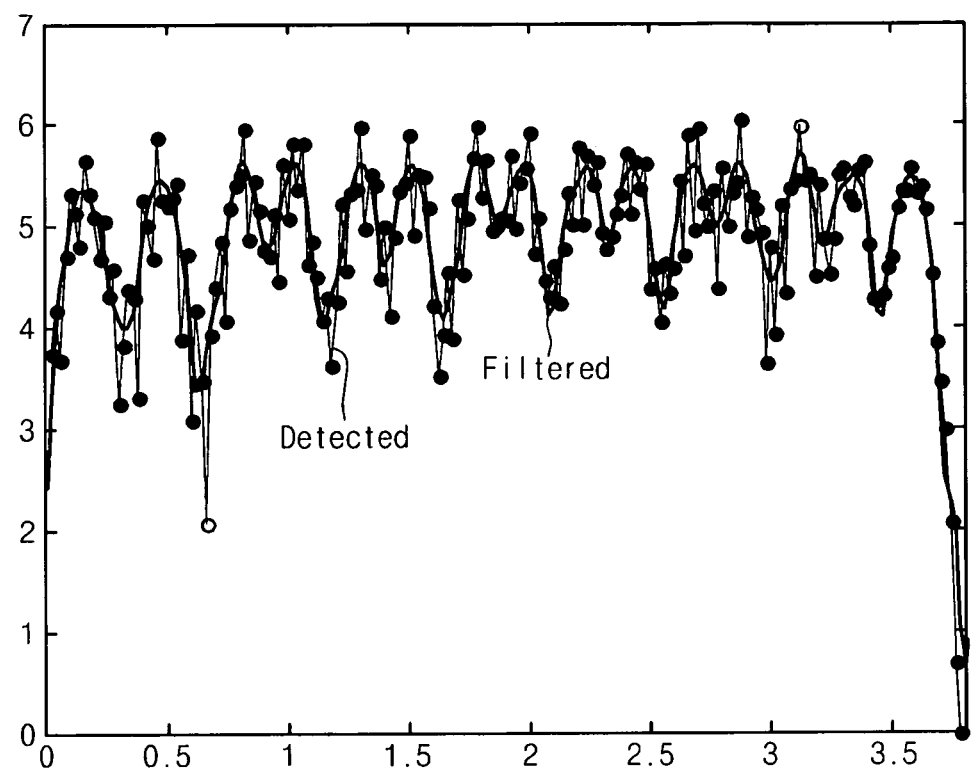
FIG. 7 is a diagram illustrating a result of applying a Fast Fourier Transform (FFT) to the measured threshold voltage distribution and the filtered threshold voltage distribution shown in FIG. 6.

FIG. 7 is a diagram illustrating a result of applying a Fast Fourier Transform (FFT) to the measured threshold voltage distribution and the filtered threshold voltage distribution shown in FIG. 6. In this case, it will be assumed that the filter 17 may be a FIR filter, the order is 20, and a cut-off frequency is about 0.2. Referring to FIG. 7, in a filtered threshold voltage distribution, a noise term may be removed from a measured threshold voltage distribution.

Figure 8:
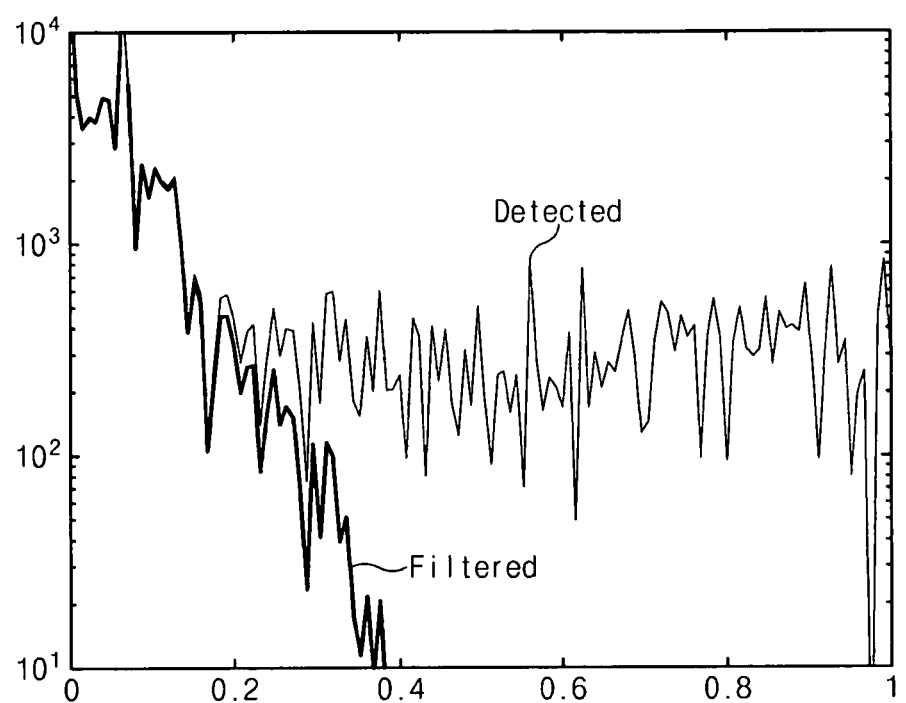
FIG. 8 is a diagram illustrating a measured threshold voltage distribution and a filtered threshold voltage distribution thereof in a NAND flash memory having 4-bit multi level cells.

FIG. 8 is a diagram illustrating a measured threshold voltage distribution and a filtered threshold voltage distribution thereof in a NAND flash memory having 4-bit multi level cells. Referring to FIG. 8, in a filtered threshold voltage distribution, local minima may be removed from a measured threshold voltage distribution.

In the storage device 10 shown in FIGS. 1 through 10, a measured threshold voltage distribution may be immediately filtered upon setting of a read level, but the memory system according to example embodiments of inventive concepts need not be limited thereto. In the storage device 10 according to example embodiments of inventive concepts, a measured threshold voltage may be modified, and then the modified threshold voltage distribution may be filtered.

Figure 9:
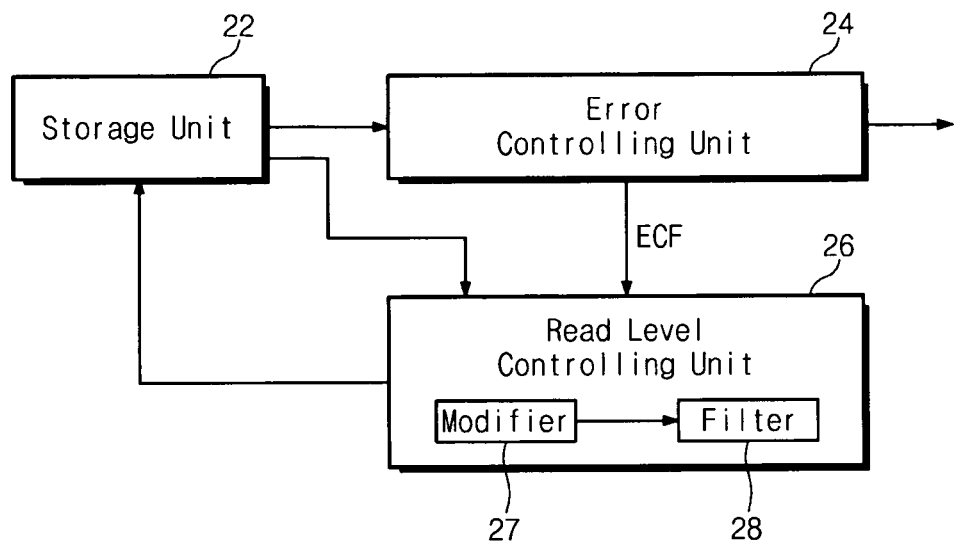
FIG. 9 is another block diagram illustrating a storage device according to example embodiments of inventive concepts.

FIG. 9 is another block diagram illustrating a storage device according to example embodiments of inventive concepts. Referring to FIG. 9, the storage device 20 may include a storage unit 22, an error controlling unit 24, and a read level controlling unit 26. The read level controlling unit 26 may further include a modifier 27 compared to the read level controlling unit 16 shown in FIG. 1. Other configurations, except the modifier 27, are similar to that described in FIG. 1.

The modifier 27 may modify a measured threshold voltage distribution. The modifier 27 may modify the measured threshold voltage distribution by various methods. For example, a transition region between states may maintain a measured value in the threshold voltage distribution. Arbitrary values may be inputted for the other regions except the transition region. The arbitrary input values may include a saturation value, an interpolation value, and a mean value. Here, the saturation value may be a constant value. The interpolation value may be the number of memory cells measured as a result of a read operation at a certain point of the threshold voltage distribution. The mean value may be an estimation value. A Gaussian probability density function may be used as a probabilistic model.

Figure 10:
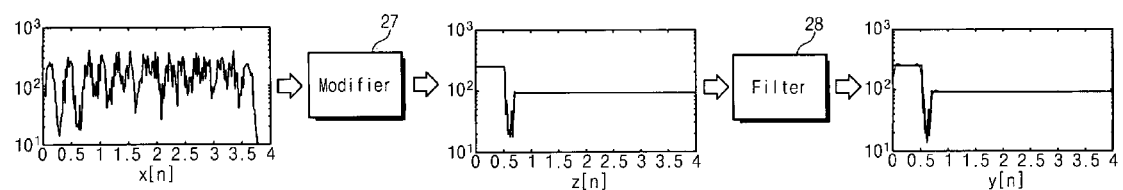
FIG. 10 is a diagram illustrating a filtering process of a threshold voltage distribution in the storage device of FIG. 9.

FIG. 10 is a diagram illustrating a filtering process of a threshold voltage distribution in the storage device of FIG. 9. Referring to FIG. 10, a measured threshold distribution x(n) may be modified by the modifier 27, and then the modified distribution z(n) may be filtered by the filter 28 to be outputted like y(n).

Figure 11:
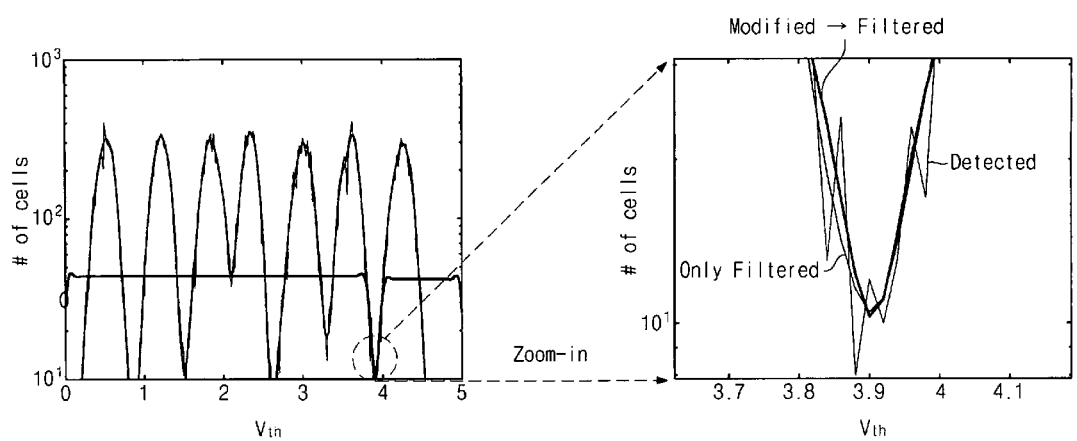
FIG. 11 is a diagram illustrating a measured threshold voltage distribution, a filtered threshold voltage distribution thereof, and a filtered threshold voltage distribution thereof after modification in a NAND flash memory having 3-bit multi level cells.

FIG. 11 is a diagram illustrating a measured threshold voltage distribution, a filtered threshold voltage distribution thereof, and a filtered threshold voltage distribution thereof after modification in a NAND flash memory having 3-bit multi level cells. Here, the modification may use a saturation value. For example, only a specific transition region between states may perform a read operation in detail, and saturation values are inputted for the other regions except the specific transition region. In this case, the specific transition region may be a region in which a plurality of local minima exist, and may have a difficulty in setting an optimum read level.

Figure 12:
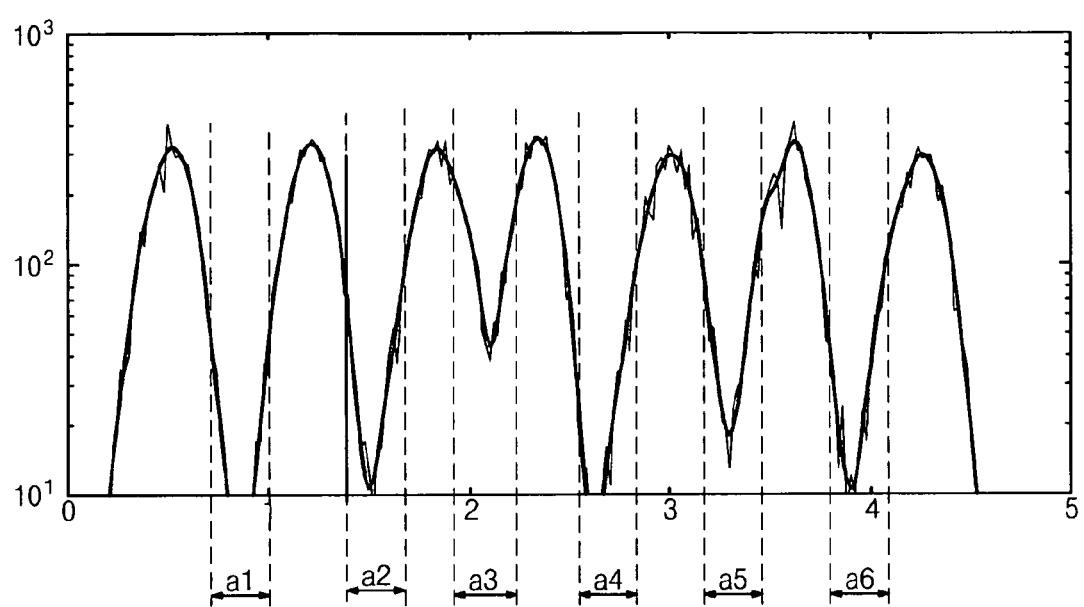
FIG. 12 is a diagram illustrating modified transit regions.

Although only the specific transition region has been modified in FIG. 11, the storage device 20 according to example embodiments of inventive concepts need not to be limited thereto. The storage device 20, as shown FIG. 12, may be implemented to modify only the transition regions a1 to a6 between states.

Figure 13:
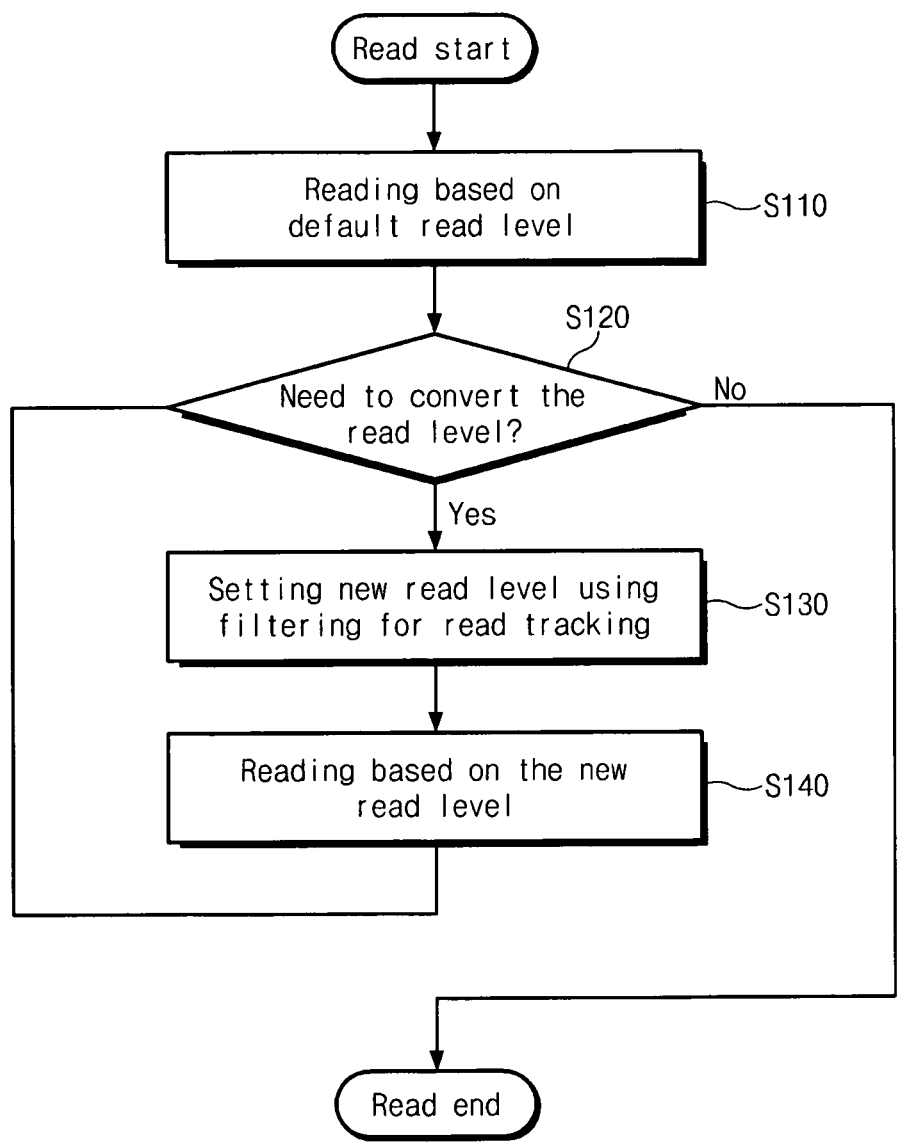
FIG. 13 is a flowchart illustrating a reading method of a memory system according to example embodiments of inventive concepts.

FIG. 13 is a flowchart illustrating a reading method of a memory system according to example embodiments of inventive concepts. Referring to FIGS. 1 and 13, the reading method of the memory system may be performed as follows.

In operation S110, data may be read from a storage unit 12 based on a default read level in a storage device 10. The error controlling unit 14 may detect errors of the read data, and then determine whether the detected error can be corrected. If there is no error, or the error correction is possible, then the read data are outputted to the outside, completing a read operation. On the other hand, if an error is detected from the read data, and the error correction is not possible, it may be determined that a current read level needs to be converted in operation S120.

If the current read level needs to be converted, a read operation may be performed on one of word lines including a memory cell in which the read data is stored, a plurality of word lines including the word line, and memory blocks including the word line, thereby measuring a threshold voltage distribution. Here, the threshold voltage distribution may be determined as the number of memory cells passed according to a variable voltage level. For example, when a read voltage of 1.0 V is applied to one of word lines, and the number of the passed memory cells is 20, the threshold voltage distribution may become (1.0, 20).

In operation S130, the read level controlling unit 16 may filter the measured threshold voltage distribution, and may set a new optimum read level from the filtered threshold voltage distribution. Based on the new read level, data are again read out from the storage unit 12 in operation S140. Thereafter, operation S120 may again be performed.

Figure 14:
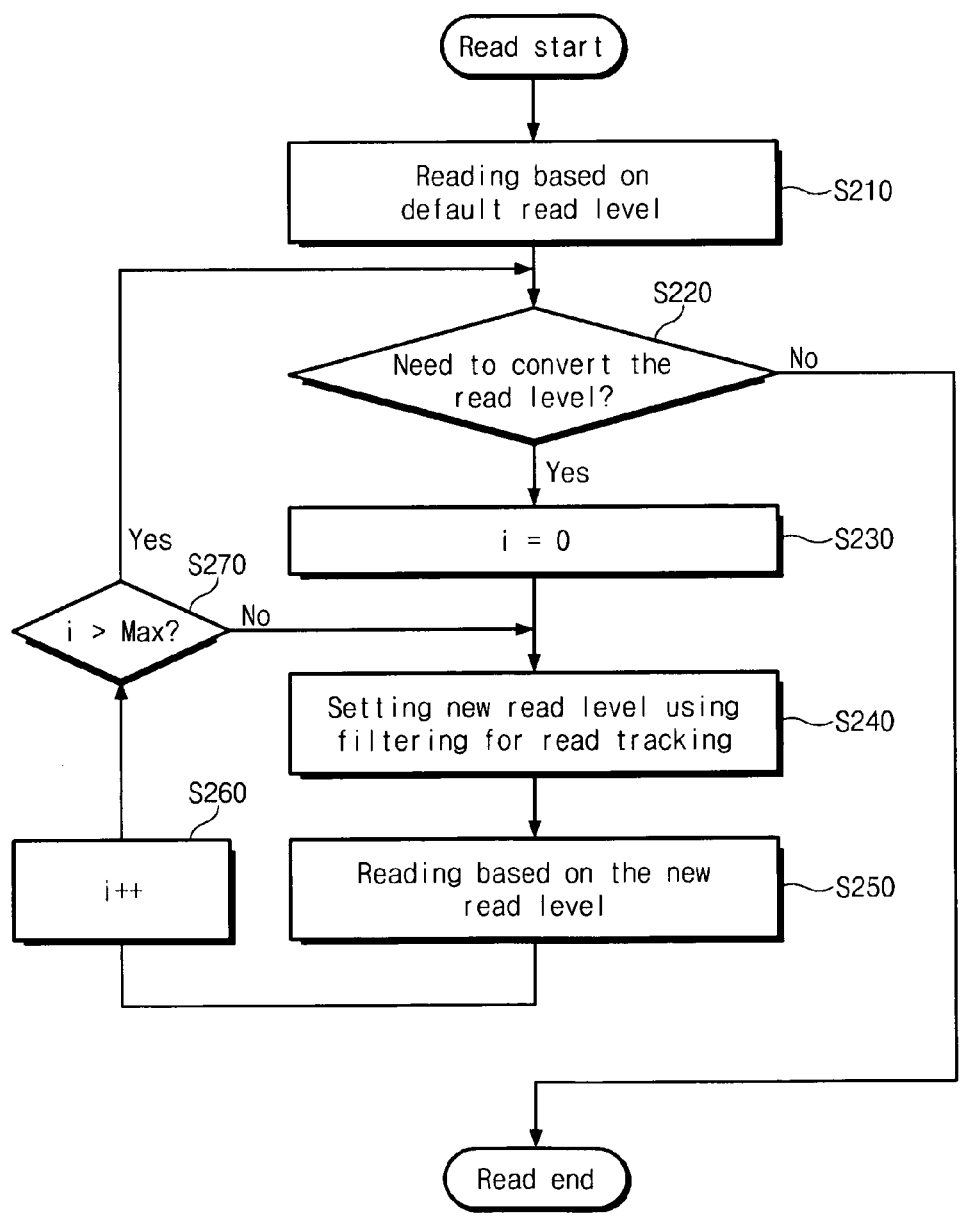
FIG. 14 is another flowchart illustrating a reading method of a memory system according to example embodiments of inventive concepts.

FIG. 14 is another flowchart illustrating a reading method of a memory system according to example embodiments of inventive concepts. Referring to FIGS. 1 through 14, the read method of the storage device may be performed as follows.

In operation S210, data may be read from a storage unit 12 based on a default read level in a storage device 10. The error controlling unit 14 may detect errors of the read data, and then determine whether the detected error can be corrected. If there is no error, or the error correction is possible, then the read data are outputted to the outside, completing a read operation. On the other hand, if an error is detected from the read data, and the error correction is not possible, it may be determined that a current read level needs to be converted in operation S220.

If the current read level needs to be converted, a read level controlling unit 16 may set a read level reset frequency (i) to 0 in operation 5230.

In operation 5240, the read level controlling unit 16 may filter the measured threshold voltage distribution, and may set a new optimum read level from the filtered threshold voltage distribution. Based on the new read level, data are again read out from the storage unit 12 in operation 5250. In operation 5260, the read level controlling unit 16 may increase the read level reset frequency (i) by 1. In operation S270, the read level controlling unit 16 may determine whether or not the read level reset frequency (i) is a maximum value. If the read level reset frequency (i) is less than or equal to the maximum value, operation S240 is performed. On the other hand, if the read level reset frequency (i) is greater than the maximum value, operation S220 is performed.

The reading method of the storage device according to example embodiments of inventive concepts may repeatedly perform a read tracking to reset a new read level.

Figure 15:
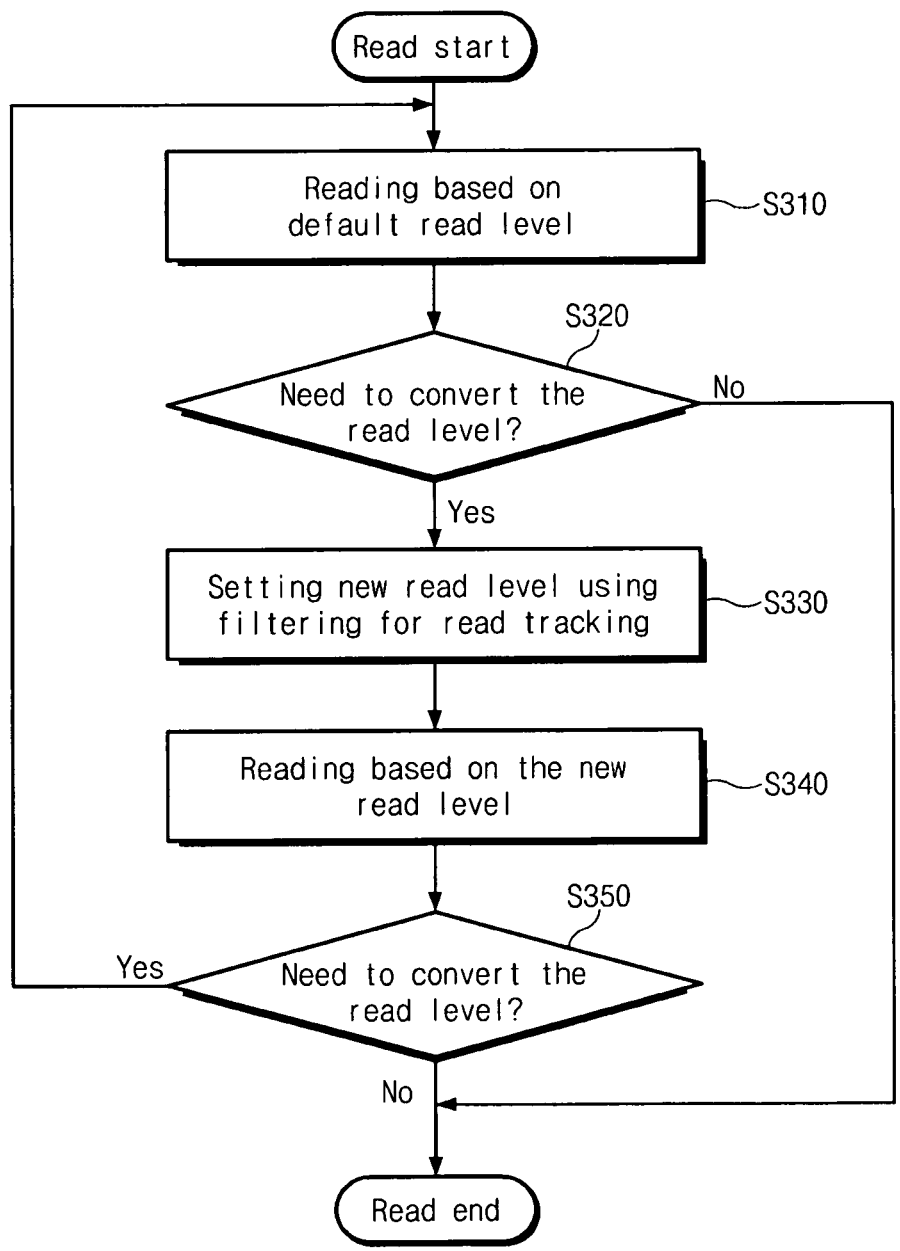
FIG. 15 is yet another flowchart illustrating a reading method of a memory system according to example embodiments of inventive concepts.

FIG. 15 is still another flowchart illustrating a reading method of a storage device according to example embodiments of inventive concepts. Referring to FIGS. 1 and 15, the reading method of the storage device may be performed as follows.

In operation S310, data may be read from a storage unit 12 based on a default read level in a storage device 10. The error controlling unit 14 may detect errors of the read data, and then determine whether the detected error can be corrected. If there is no error, or the error correction is possible, then the read data are outputted to the outside, completing a read operation. On the other hand, if an error is detected from the read data, and the error correction is not possible, it may be determined that a current read level needs to be converted in operation S320.

If the current read level needs to be converted, a read operation may be performed on one of word lines including a memory cell in which the read data is stored, a plurality of word lines including the word line, and memory blocks including the word line, thereby measuring a threshold voltage distribution. In operation 5330, the read level controlling unit 16 may filter the measured threshold voltage distribution, and may set a new optimum read level from the filtered threshold voltage distribution. Based on the new read level, data are again read out from the storage unit 12 in operation S340.

The error controlling unit 14 may detect errors of the read data, and then determine whether the detected error can be corrected. If there is no error, or the error correction is possible, then the read data are outputted to the outside, completing a read operation. On the other hand, if an error is detected from the read data, and the error correction is not possible, a current read level is converted into the default read level in operation S350.

The read method of the storage device according to example embodiments of inventive concepts may set a new read level, and then convert the new read level into the default read level.

Figure 16:
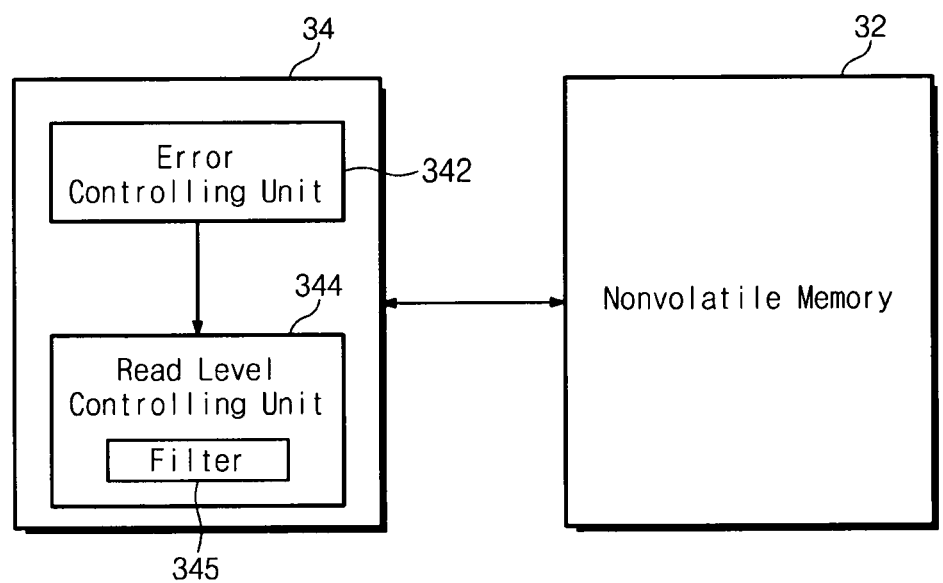
FIG. 16 is a block diagram illustrating a memory system according to example embodiments of inventive concepts.

FIG. 16 is a block diagram illustrating a memory system according to example embodiments of inventive concepts. Referring to FIG. 16, a memory system 30 may include a non-volatile memory 32 and a memory controller 34 controlling the same.

The non-volatile memory 32 may include NAND flash memories, NOR flash memories, PRAMs, and MRAMs.

A memory controller 34 may include an error controlling unit 342 and a read level controlling unit 344. Here, the read level controlling unit 344 may include a filter 345. The error controlling unit 342 may be implemented similarly to the error controlling unit 14 shown in FIG. 1, and the read level controlling unit 344 may be implemented similarly to the read level controlling unit 16 shown in FIG. 1.

Figure 17:
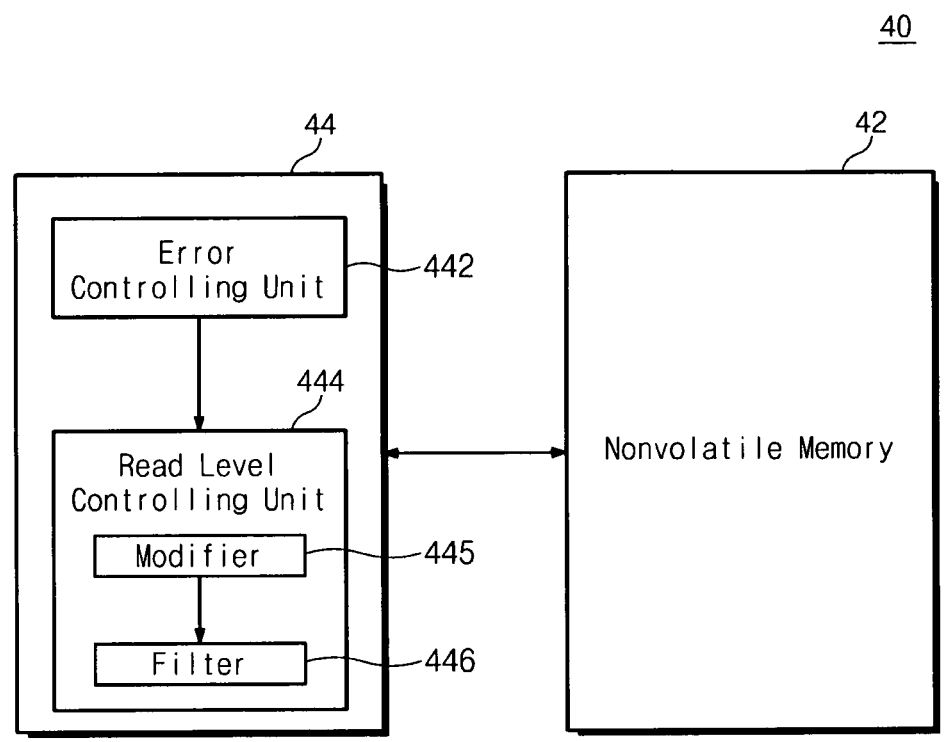
FIG. 17 is another block diagram illustrating a memory system according to example embodiments of inventive concepts.

FIG. 17 is another block diagram illustrating a memory system according to example embodiments of inventive concepts. Referring to FIG. 17, a memory system 40 may include a non-volatile memory 42 and a memory controller 44 controlling the same.

A memory controller 44 may include an error controlling unit 442 and a read level controlling unit 444. Here, the read level controlling unit 444 may include a modifier 455 and a filter 346. The error controlling unit 442 may be implemented similarly to the error controlling unit 24 shown in FIG. 9, and the read level controlling unit 444 may be implemented similarly to the read level controlling unit 26 shown in FIG. 9.

Figure 18:
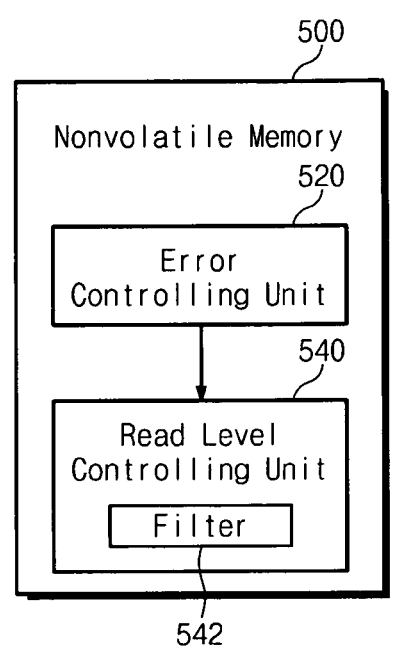
FIG. 18 is a diagram illustrating a non-volatile memory according to example embodiments of inventive concepts.

FIG. 18 is a diagram illustrating a non-volatile memory according to example embodiments of inventive concepts. Referring to FIG. 18, a non-volatile memory 500 may include an error controlling unit 520 and a read level controlling unit 540. Here, the read level controlling unit 540 may include a filter 542. The error controlling unit 520 may be implemented similarly to the error controlling unit 14 shown in FIG. 1, and the read level controlling unit 540 may be implemented similarly to the read level controlling unit 16 shown in FIG. 1.

Figure 19:
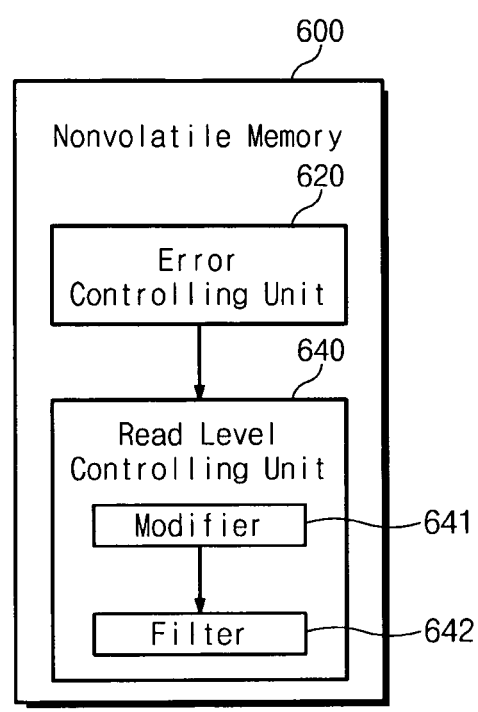
FIG. 19 is another diagram illustrating a non-volatile memory according to example embodiments of inventive concepts.

FIG. 19 is another diagram illustrating a non-volatile memory according to example embodiments of inventive concepts. Referring to FIG. 19, a non-volatile memory 600 may include an error controlling unit 620 and a read level controlling unit 640. Here, the read level controlling unit 640 may include a modifier 641 and a filter 642. The error controlling unit 620 may be implemented similarly to the error controlling unit 24 shown in FIG. 9, and the read level controlling unit 640 may be implemented similarly to the read level controlling unit 26 shown in FIG. 9.

Figure 20:
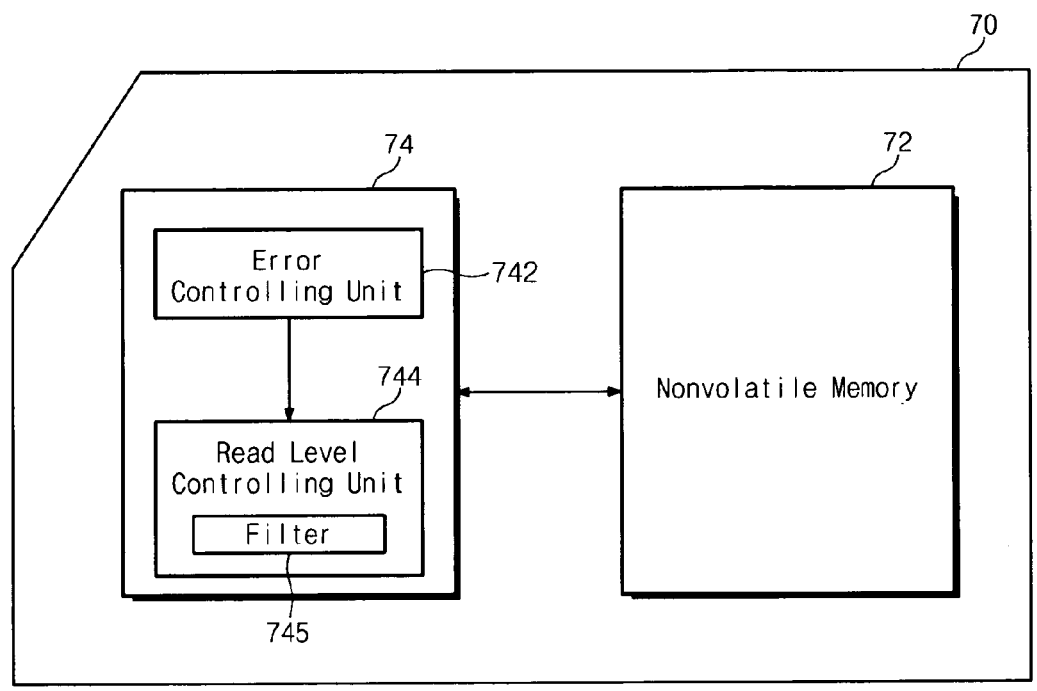
FIG. 20 is a diagram illustrating a memory card according to example embodiments of inventive concepts.

FIG. 20 is a diagram illustrating a memory card according to example embodiments of inventive concepts. Referring to FIG. 20, a memory card 70 may include a NAND flash memory 72 and a memory controller 74 controlling the same.

The memory controller 74 may include an error controlling unit 742 and a read lever controlling unit 744. Here, the read level controlling unit 744 may include a filter 745. The error controlling unit 742 may be implemented similarly to the error controlling unit 14 shown in FIG. 1, and the read level controlling unit 744 may be implemented similarly to the read level controlling unit 16 shown in FIG. 1. The memory card 70 may be applied to a MultiMedia Card (MMC) or an SD card.

Figure 21:
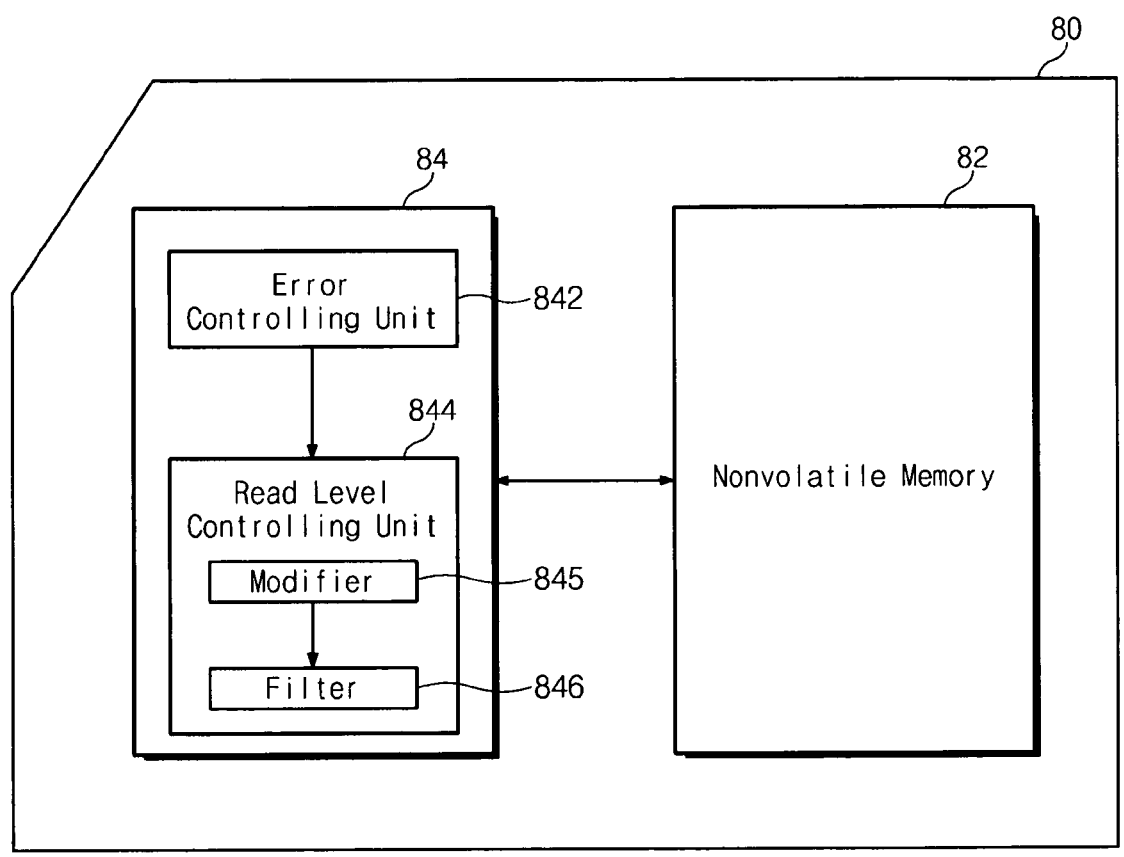
FIG. 21 is another diagram illustrating a memory card according to example embodiments of inventive concepts.

FIG. 21 is another diagram illustrating a memory card according to example embodiments of inventive concepts. Referring to FIG. 21, a memory card 80 may include a NAND flash memory 82 and a memory controller 84 controlling the same.

The memory controller 84 may include an error controlling unit 842 and a read lever controlling unit 844. Here, the read level controlling unit 844 may include a modifier 845 and a filter 846. The error controlling unit 842 may be implemented similarly to the error controlling unit 24 shown in FIG. 9, and the read level controlling unit 844 may be implemented similarly to the read level controlling unit 26 shown in FIG. 9.

On the other hand, the memory system according to example embodiments of inventive concepts may also be applied to a Solid State Disk (SSD).

Figure 22:
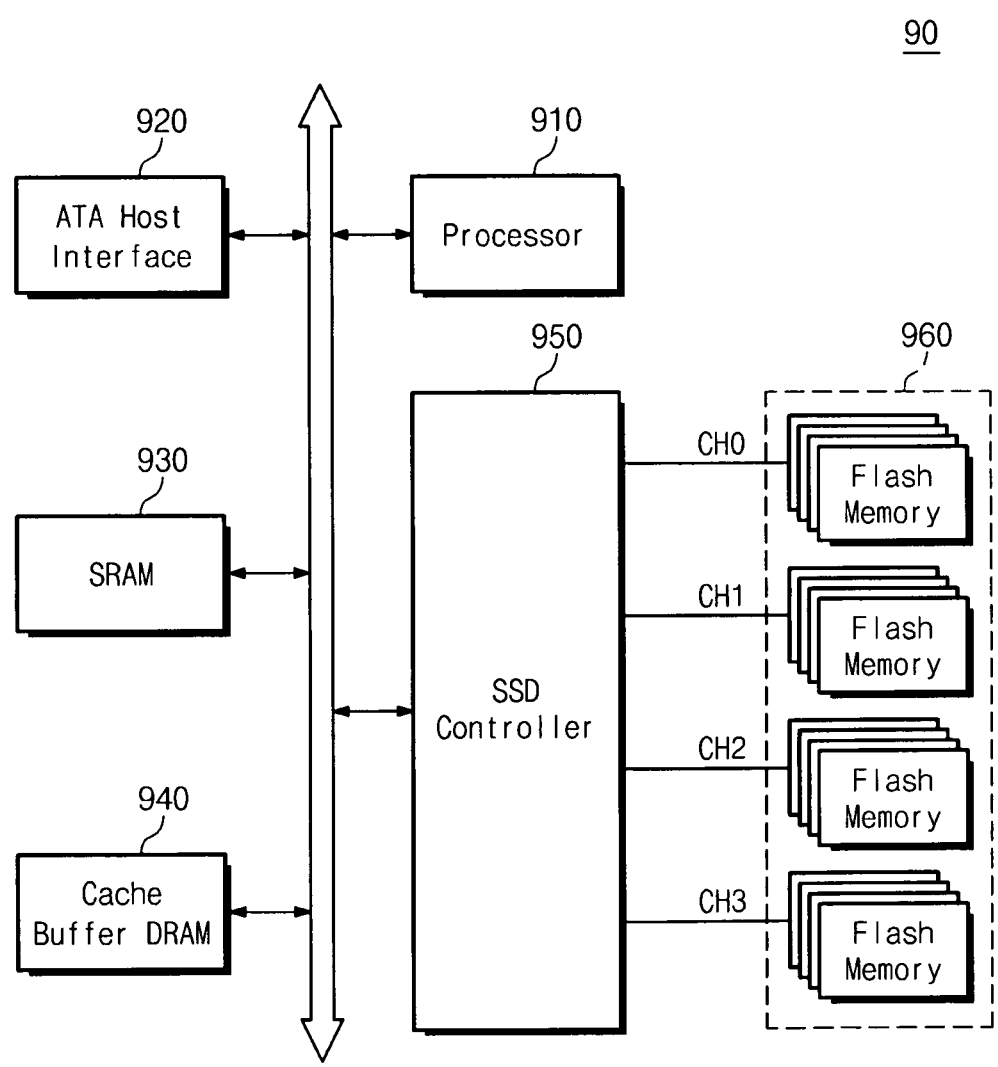
FIG. 22 is a diagram illustrating a Solid State Disk (SSD) according to example embodiments of inventive concepts.

FIG. 22 is a diagram illustrating an SSD according to example embodiments of inventive concepts. Referring to FIG. 22, an SSD 90 may include an SSD controller 950 and a plurality of flash memories 960. The SSD controller 950 may be implemented to have the same configuration as the memory controller 34 shown in FIG. 16.

Referring again to FIG. 22, a processor 910 may receive commands from a host, and may determine whether to store data from the host in a flash memory or to read data stored in the flash memory to transmit the data to the host.

An ATA host interface 920 may exchange data with the host according to the control of the processor 910. The ATA interface 920 may fetch commands and addresses from the host and deliver the command and addresses to the processor 910 through a CPU bus. Here, the ATA host interface 920 may be one of an SATA interface, a PATA interface, and an ESATA (External SATA) interface.

Data inputted from the host through the ATA host interface 920 or transmitted to the host may be delivered through a cache buffer RAM 940, not via the CPU bus according to the control of the processor 910.

A RAM 930 may be used to temporarily store data necessary for the operation of the flash memory system 90. The RAM, which is a volatile memory, may include a DRAM or an SRAM.

The cache buffer RAM 940 may temporarily store exchange data between the host and the flash memories 960. Also, the cache buffer RAM 940 may also be used to store a program to be operated by the processor 910. The cache buffer RAM 940 may be considered as a sort of a buffer memory, and may be implemented using an SRAM.

The SSD controller 950 may exchange data with the flash memories 960 that are used as storage devices. The SSD controller 950 may be configured to support NAND flash memories, one-NAND flash memories, multi level flash memories, and single level flash memories.

On the other hand, the processor 910 and the SSD controller 950 may be implemented using a single ARM processor.

The memory systems according to example embodiments of inventive concepts may be used as mobile storage devices. Accordingly, the memory systems may be used as storage devices of MP3s, digital cameras, PDAs, e-books, digital TVs, and computers.

The memory systems or storage devices according to example embodiments of inventive concepts may be mounted in various forms of packages. For example, the memory systems or storage devices may be mounted in packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

In the storage device and the method for reading the same according to example embodiments of inventive concepts an optimum or improved read level may be set based on a distribution filtered in a read operation.

The above-disclosed subject matter is to be considered illustrative and not restrictive, and the appended claims are intended to cover all such modifications, enhancements, and other example embodiments of inventive concepts, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A storage device comprising:
a storage unit configured to store data;
an error controlling unit configured to correct an error of the data read out from the storage unit according to at least one read level; and
a read level controlling unit including a filter and a modifier and configured to control the at least one read level when the error is uncorrectable, wherein
the read level controlling unit is configured to measure a distribution of memory cells of the storage unit, configured to modify the measured distribution, configured to filter the modified distribution using the filter, and configured to reset the at least one read level based on the filtered distribution,
the modifier is configured to modify a first region of a plurality of regions of the measured distribution in which a plurality of local minima exist where there is difficulty in setting the read level and configured to input values for at least a second region of the plurality of regions separate from the first region, and
the filter is configured to filter the modified distribution to remove local minima in the modified distribution.

2. The storage device of claim 1, wherein,
the storage unit is a NAND flash memory, and
the read level controlling unit is configured to filter the modified distribution by units of at least one word line.

3. The storage device of claim 1, wherein,
the storage unit is a NAND flash memory, and
the read level controlling unit is configured to filter the modified distribution within a portion of a voltage section of the modified distribution.

4. The storage device of claim 1, wherein the values include at least one of a saturation value, an interpolation value, and a mean value, where the saturation value is a constant, the interpolation value is the number of memory cells measured as a result of a read operation of the threshold voltage distribution, and the mean value is an estimation value.

5. The storage device of claim 4, wherein,
the filter is configured to remove at least one of a plurality of local minima from the modified distribution of memory cells, and
the read level controlling unit is configured to set the read level based on at least one of a remaining local minimum of the plurality of local minima from the filtered distribution.

6. The storage device of claim 5, wherein the filter is a Finite Impulse Response (FIR) filter configured to filter according to the equation, $$y(n)=h(n)*x(n)$$

where x(n) is a number of memory cells according to a threshold voltage (n), h(n) is a transfer function, y(n) is a value filtered by the filter, and * defines a convolution.

7. The storage device of claim 6, wherein the storage unit is a NAND flash memory including,
a memory cell array including a plurality of memory blocks having a plurality of memory cells,
a row decoder configured to select one of the memory blocks according to an input address,
an input/output buffer circuit configured to temporarily store data at least one of to be loaded to and read out from the memory cell array, and
a control logic configured to store reference voltages of the read level, wherein
the read level controlling unit is configured to change the reference voltages of the read level.

8. The storage device of claim 1, wherein the filter is a Finite Impulse Response (FIR) filter configured to filter according to the equation, $$y(n)=h(n)*x(n)$$

where x(n) is a number of memory cells according to a threshold voltage (n), h(n) is a transfer function, y(n) is a value filtered by the filter, and * defines a convolution.

9. The storage device of claim 1, wherein,
the filter is configured to remove at least one of a plurality of local minima from the modified distribution of the memory cell, and
the read level controlling unit is configured to set the read level based on at least one of a remaining local minimum of the plurality of local minima from the filtered distribution.

10. The storage device of claim 1, wherein the storage unit is a NAND flash memory including,
a memory cell array including a plurality of memory blocks having a plurality of memory cells,
a row decoder configured to select one of the memory blocks according to an input address,
an input/output buffer circuit configured to temporarily store data at least one of load to and read out from the memory cell array, and
a control logic configured to store reference voltages of the read level, wherein
the read level controlling unit is configured to change the reference voltages of the read level.

11. The storage device of claim 1, wherein the storage unit is a memory device, and the error controlling unit and the read level controlling unit are provided in a memory controller configured to control the memory device.

12. A method for reading a storage device, comprising:
determining whether to convert a read level according to an error of data that is read according to at least one first read level, and if the determining determines to convert the read level,
first measuring a distribution of memory cells of the storage device;
modifying the measured distribution, the modifying including (1) modifying a first region of a plurality of regions of the measured distribution in which a plurality of local minima exist where there is difficulty in setting the read level and (2) inputting values for at least a second region of the plurality of regions separate from the first region;

filtering the modified distribution using a filter, the filter configured to filter the modified distribution to remove local minima in the modified distribution;

setting at least one second read level;

second measuring the distribution of the memory cells of the storage device based on the filtered distribution; and reading the data based on the at least one second read level.

13. The method of claim 12, further comprising:
resetting of the at least one second read level after the reading.

14. The method of claim 13, wherein the determining, the first measuring, the modifying, the filtering, the setting, the second measuring, the reading and the resetting are performed repeatedly until the second read level satisfies an error correction threshold.

15. The method of claim 12, wherein the determining includes converting the read level from the at least one second read level to the at least one first read level based on an error correction threshold.

* * * * *